United States Patent
Kessler et al.

(10) Patent No.: US 6,797,936 B1
(45) Date of Patent: Sep. 28, 2004

(54) AUTOMATED LASER DIODE TESTING

(75) Inventors: Jack Stephen Kessler, Mountain Ranch, CA (US); Jim Tark Chiu, Los Altos, CA (US)

(73) Assignee: Opto Electronic Systems, Inc., Sunnyvale, CA (US)

( * ) Notice: Subject to any disclaimer, the term of this patent is extended or adjusted under 35 U.S.C. 154(b) by 301 days.

(21) Appl. No.: 10/039,711

(22) Filed: Jan. 3, 2002

(51) Int. Cl.$^7$ .............................................. H01J 40/14
(52) U.S. Cl. ..................................... 250/221; 324/767
(58) Field of Search ................................ 250/221, 548, 250/559.3, 559.4, 214 R, 214.1, 239; 324/767, 765

(56) References Cited

U.S. PATENT DOCUMENTS 5,498,973 A * 3/1996 Cavaliere et al. ........... 324/765

OTHER PUBLICATIONS

"High–Density Laser Diode Controller," Photonics, Model 8016, URL; www.newport.com/tile.store/PDFs/tempPDFs/Model$_{13}$ 801b_HighDensity2827 .pdf, pp. 9–13, no date.
"Laser Diode Bum–In and Life Test Systems– Butterfly Devices," Photonics, URL: www.newport.com/file_store/PDFs/tempPDFs/Laser_Diode_BumIn4004.pdf, pp. 2–3, no date.
"Multiple Channel Laser Diode Characterization Systems," Photonics, URL: www.newport.com/files_store/PDF's/tempPDFs/Multiple_Channel2848.pdf, pp. 66–67, no date.

"Integrating Sphere Optical Power Measurement Systems," URL: www.newport.com. pp. 3–30, no date.

"Laser Diode Autobar Test & Characterization System," Newport, pp. 8–3–8–4, no date.

* cited by examiner

Primary Examiner—Que T. Le
(74) Attorney, Agent, or Firm—Haverstock & Owens LLP

(57) ABSTRACT

A testing system includes a device independent handling system utilizing removable collets that are customized for various device configurations and provide unique mechanical, thermal and electrical contact to a device-under-test (DUT) without the use of clamps, screws or traditional means of securing a DUT in a test or burn in fixture. The system is designed for automatically loading and positioning each of a plurality of laser diode sub-assemblies, an optical system for automatically receiving each laser diode subassembly from the handling system and automatically performing one or more tests to measure functionality of each laser diode sub-assembly, a detection system for detecting characteristics associated with one or more tests performed by the optical system for each laser diode sub-assembly, and a control system for automatically receiving detected characteristics from the detection system, comparing the detected characteristics to stored expected characteristics for a properly functioning laser diode sub-assembly, and providing control instructions to the optical system based on the comparison. The one or more tests are performed by automatically positioning a lens such that light generated from the laser diode sub-assembly is formed into laser light, and each test measures a desired characteristic of the laser light.

16 Claims, 11 Drawing Sheets

AUTOMATED LASER DIODE TESTING

FIELD OF THE INVENTION

The invention relates to an apparatus and method of automatically testing laser devices. More particularly, the invention relates to an apparatus and method of automatically testing laser diode sub-assemblies.

BACKGROUND OF THE INVENTION

Laser diode assemblies are constructed using a vertical surface laser die mounted onto a post. The vertical surface laser die generates a divergent light, similar to a flashlight and requires an external lense to lase. The die is bonded to the top of a metal post that is used to provide a secure base for the die as well as conduct electricity, but most importantly to conduct heat away from the die. The post and one contact of the die are wired together, and a wire or thin metal ribbon is extended from the other contact on the die. The extended wire or thin metal ribbon is called a tab and serves only as an electrical contact. Such a configuration is referred to as a chip-on-post, or COP. At this stage, the die has yet to be tested. When testing the COP, the objective is to simulate actual conditions by applying power to the COP and measuring the light output characteristics. Two characteristics are typically measured to determine whether or not the die is functioning correctly, the power and the light spectrum. The spectrum of the light output generally measures the number and shape of pulses, and the power of the light measures the light power output versus the power input.

To test the COP, a mechanical mount is used to hold the post and the tab in place. In typical test situations, up to 5 amps are pulled through the COP. If the heat is not sufficiently dissipated, the tab and/or the die will burn up. The COP is typically mechanically clamped in a conductive metal fixture to draw away the heat generated during testing and act as an electrode.

Once the COP is mechanically and electrically clamped, the divergent light from the die needs to be focused and reflected using an external lens. That is, the light is focused into a parallel beam that makes a laser light. Lasing the divergent light is accomplished by properly positioning a lens within the path of the divergent light. This arrangement is referred to as a laser diode sub-assembly. FIG. 1 illustrates a laser diode sub-assembly of the prior art. A die 20 is bonded and wired to a post 10. A tab 30 is coupled to the die 20 and the post 10 via the wired connection. The post 10, the die 20 and the tab 30 together form a COP. When power is applied to the COP, a divergent light output 40 is generated. A lens 50 is properly positioned in the path of the divergent light output 40 to focus the divergent light 40 into laser light 60.

Conventionally, both the lens and the COP are mounted on optical mounts. The mounts holding the lens and COP are coupled to micrometers that move the mounts, and therefore the lens and COP, in very small, incremental steps. A human operator, usually a highly trained optical technician, manually turns the knobs on the micrometers to obtain proper COP and lens alignment. The operator turns the micrometer knobs that in turn move the lens and COP back and forth, up and down, as well as tilting to obtain proper alignment for lasing. The operator monitors the output of a measuring device while moving the knobs to determine if the lens is being moved in the proper direction. The operator continues to adjust the micrometers and monitor the measurement device until the lens and COP are approximately positioned. The operator continues to adjust the micrometers until the highest readings are obtained and then manually records the final measurements. Such a process is very time consuming and subject to operator expertise and training, not to mention the inability to securely couple data taken with the device tested. This process is also potentially dangerous since lasing of the divergent light is performed in an open, unsafe environment. Operators are required to wear laser-proof glasses to prevent injury, but accidents can happen.

The power and the spectrum of the laser light are tested. This requires two different tests, each test requiring a different detection device. One detection device is used to detect the spectrum or frequency of the laser light. This detection device is coupled to a spectrum analyzer to measure spectrum characteristics. A second detection device is used to detect the power of the laser output. This detection device is then coupled to a power meter and the results of the voltage-ampere curve and peak power output of the laser light are recorded. Once the first test is completed, the COP is then aligned the second detection device in order to perform the second test. Either the detectors are interchanged or the COP may be moved to a different test setup. As a rule, the lens will need to be re-aligned when performing the second test. Even when the lens does not need to be re-aligned, changing the detection devices or moving the COP into different setups is very time consuming and prone to errors.

When performing a test on a different COP, re-alignment of the lens is necessary due to the irregularities from one COP to the next. Each die will be different due to the nature of the wafer fabrication process. Additionally, there are irregularities associated with mounting the die to the post. Mounting of the die is done using a special epoxy that mechanically and thermally bonds the die to the post. The assembly is then put in an oven to allow curing of the epoxy before the next step. Manufacturing processes associated with bonding a die on a post specify tolerances within which the die is to be placed on the post. Preferably, die are placed in the center of the post and flat relative to the top of the post. However, manufacturing processes introduce undesirable variables, so that every die is not positioned exactly the same as the next die.

SUMMARY OF THE INVENTION

A preferred embodiment of the present invention automatically tests a laser diode sub-assembly using a testing system. The testing system automatically loads, positions, transports, aligns, tests, records data and unloads each serialized laser diode sub-assembly to be tested without need of user interaction. While the preferred embodiment of the present invention is used to perform automated testing of COP laser diode subassemblies, the testing system of the present invention is also capable of performing automated testing on most laser diode assemblies as well as other devices under test (DUTs) with power up to 25 watts.

According to an aspect of the present invention, a testing system includes a handling system for automatically loading and positioning within a given tolerance each of a plurality of laser diode sub-assemblies, an optical system for automatically receiving each laser diode subassembly from the handling system and automatically performing one or more tests to measure functionality of each laser diode sub-assembly, a detection system for detecting characteristics associated with one or more tests performed by the optical system for each laser diode sub-assembly, and a control system for automatically receiving detected characteristics from the detection system, comparing the detected characteristics to stored expected characteristics for a properly functioning laser diode sub-assembly thereby forming a comparison, and providing control instructions to the optical system based on the comparison. The one or more tests are performed by automatically positioning a lens such that light generated from the laser diode sub-assembly is formed into laser light, and each test measures a desired characteristic of the laser light. The detection system includes one or more detection devices, each detection device corresponding to one of the one or more tests performed. The testing system also includes a mirror assembly properly positioned to direct the laser light to the one detection device corresponding to the test currently being performed by the optical system. Each detection device detects data associated with the desired characteristic and transmits the detected data to the control system. The control system periodically sends control instructions to the optical system in response to the received detected data to incrementally adjust the position of the lens until an optimal lens position is obtained. The optical system also includes one or more motors used to incrementally adjust the position of the lens. The handling system positions the laser diode sub-assembly at a specific location within a collet and maneuvers the collet with the positioned laser diode sub-assembly to a specific location within the optical system. The control system stores the detected characteristics and associates the detected characteristics to the laser diode sub-assembly from which the detected characteristics are generated. The handling system comprises a loading device for automatically loading and unloading each of the laser diode sub-assemblies into and out of one of one or more collets, a carousel including one or more nests, each nest for supporting one of the one or more collets, wherein the carousel moves each collet from a loading position, to one or more testing positions, and to an unloading position. Each collet supported by the carousel is thermally conditioned by a thermo-electronic controller to within a first thermal tolerance. The optical system automatically secures the collet into a specified position by actuating a thermal conditioning apparatus against a bottom surface of the collet. The collet, once moved to one of one or more testing positions, is automatically removed from the carousel and loaded into the optical system by the handling system. The testing system also includes a thermal conditioning apparatus within the optical system for thermally conditioning the collet to within a second thermal tolerance and to dynamically thermally condition the collet as power is applied to the laser diode sub-assembly within the collet during one of the one or more tests performed in order to maintain the thermal conditioning of the collet within the second thermal tolerance. Each laser diode sub-assembly to be loaded into one of the one or more collets is carried over a camera by the loading device prior to loading the laser diode sub-assembly into the collet wherein the camera scans an identification marking on the laser diode sub-assembly for tracking the laser diode sub-assembly within the testing system and to associate the detected characteristics of each test performed on the laser diode sub-assembly to the identification marking of the laser diode sub-assembly. Each laser diode sub-assembly to be unloaded from handling system is carried over a camera by the loading device subsequent to removing the laser diode sub-assembly from the collet wherein the camera scans the identification marking on the laser diode sub-assembly for identifying the laser diode sub-assembly and confirming that the laser diode sub-assembly is unloaded from the handling system. The carousel incrementally rotates through a plurality of positions, wherein the loading position and the one or more testing positions are included within the plurality of positions, further wherein the handling system uses sensors to monitor that the carousel accurately increments from one position to the next. The sensors also monitor that the laser diode sub-assembly is positioned within the collet within the given tolerance.

According to another aspect of the present invention, an automatically aligning optical testing system includes means for securing a laser diode sub-assembly into a fixed position, a lens for lasing a light output from the laser diode sub-assembly, a vertical means for clamping the lens into a fixed vertical position, a rotational means for clamping the lens into a fixed rotational position, means for applying power to the laser diode sub-assembly, a mirror assembly for directing the laser light to a detection device, a first motor coupled to the vertical means for clamping for moving the vertical means for clamping in a vertical direction, thereby vertically moving the lens, a second motor coupled to the rotational means for clamping for rotating the rotational means for clamping, thereby rotating the lens, and a receiving circuit coupled to the first motor and to the second motor for receiving control instructions from a control system, wherein the control system determines the control instructions by analyzing the laser light detected by the detection device, wherein the control instructions instruct the first and second motors to incrementally step thereby adjusting the position of the lens relative the fixed position of the laser diode sub-assembly, further wherein the receiving circuit iteratively receives control instructions to adjust the position of the lens until an optimal lens position is reached at which time testing of the laser diode sub-assembly is performed. The first and the second motors are picomotors. The means for securing the laser diode sub-assembly into the fixed position includes positioning the laser diode sub-assembly into a collet and actuating a thermal conditioning apparatus against a bottom surface of the collet. The thermal conditioning apparatus thermally conditions the collet to within a thermal tolerance and dynamically thermally conditions the collet as power is applied to the laser diode sub-assembly in order to maintain the thermal conditioning of the collet within the thermal tolerance. The automatically aligning optical testing system also includes an air cylinder coupled to the mirror assembly for rotating a mirror within the mirror assembly thereby directing the laser light to one of one or more detection devices.

According to yet another aspect of the present invention, a method of automatically performing optical tests on a device includes automatically loading a laser diode sub-assembly within a holding device, automatically positioning the holding device within a lens assembly, automatically detecting desired characteristics of a laser light output from the laser diode sub-assembly, automatically comparing the detected characteristics to stored expected characteristics for a properly functioning laser diode sub-assembly, automatically providing control instructions to adjust the position of the lens assembly relative to the laser diode sub-assembly based on the comparison, automatically repeating automatically detecting, automatically comparing and automatically providing until the lens assembly is adjusted into an optimal position, and automatically determining test results by analyzing the detected desired characteristics while the lens assembly is in the optimal position. The method further includes automatically re-directing the laser light to detect different desired characteristics of the laser light. The method further includes automatically comparing the different detected characteristics to stored expected characteristics for a properly functioning laser diode sub-assembly, automatically providing control instructions to adjust the position of the lens assembly relative the laser diode sub-assembly based on the comparison, repeating these steps until the lens assembly is adjusted into an optimal position, and determining test results by analyzing the different detected desired characteristics while the lens assembly is in the optimal position.

According to still yet another aspect of the present invention, an apparatus for securing, locating, electrically and thermally contacting a device under test comprises a block of thermally conductive material, a channel extending vertically through the block and extending horizontally from a front surface of the block towards a back surface of the block without reaching the back surface and a positioning hole extending vertically through the block and intersecting the channel, wherein the positioning hole includes a top portion with a width larger than a width of a bottom portion of the positioning hole, further wherein the top portion is sufficiently long as to position the device under test within the positioning hole such that a bottom surface of the device under test rests at a top of the bottom portion of the positioning hole and a top surface of the device under test rests above a top surface of the block, wherein the channel is widened from a standard configuration to an extended configuration by applying a prying means to the channel, and the channel returns to the standard configuration from the extended configuration upon removing the prying means from the channel. The block is preferably made of beryllium copper. The channel includes a wedge-shaped opening at the front surface of the block. A cross-section of the top portion of the positioning hole matches a cross-section of the device under test. The prying means is a wedge and the channel is widened to the extended configuration by pressing the wedge into the wedge-shaped opening of the channel. The width of the top portion of the positioning hole is larger than a width of the channel and equal to a width of the device under test. The cross-section of the top portion of the positioning hole and the device under test is circular.

According to yet another aspect of the present invention, an apparatus for securing a device under test includes a beryllium copper block, a channel horizontally bisecting the block such that the channel extends vertically from a top surface of the block through a bottom surface of the block, and the channel extends horizontally from a front surface of the block past a center of the block but not as far as a back surface of the block, wherein the channel includes a wedge-shaped opening at the front surface of the block, and a positioning hole extending from a top center of the top surface of the block to a bottom center of the bottom surface of the block and intersecting the channel, wherein a cross-section of the positioning hole matches a cross-section of the device under test, further wherein the positioning hole includes a top portion with a width larger than a width of the channel and equal to a width of the device under test, and a bottom portion with a width less than the width of the device under test, further wherein the top portion is sufficiently long as to position the device under test within the positioning hole such that a bottom surface of the device under test rests at a top of the bottom portion of the positioning hole and a top surface of the device under test rests above the top surface of the block, wherein the width of the channel is widened from a standard width to an extended width by pressing a wedge into the wedge-shaped opening of the channel and the width of the channel returns to the standard width when the wedge is removed from the wedge-shaped opening. The device under test is a laser diode sub-assembly. The cross-section of the positioning hole and the laser diode sub-assembly is circular.

DETAILED DESCRIPTION OF THE PREFERRED EMBODIMENT

A preferred embodiment of the present invention automatically tests a laser diode sub-assembly using a testing system. The testing system automatically loads, positions, transports, tests, and unloads each laser diode sub-assembly to be tested without need of user interaction. While the preferred embodiment of the present invention is used to perform automated testing of laser diode subassemblies, the testing system of the present invention is also capable of performing automated testing on laser diode assemblies as well as other devices under test (DUTs).

Figure 1:
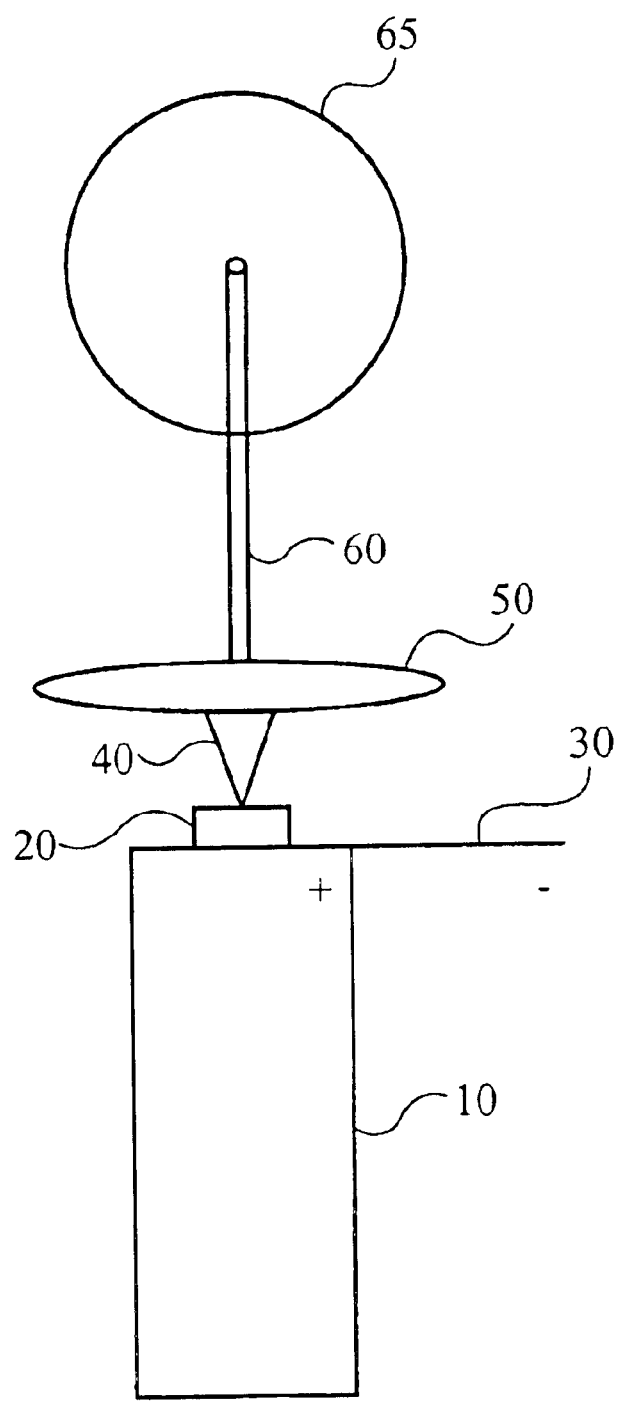
FIG. 1 illustrates a laser diode sub-assembly of the prior art.
Figure 2:
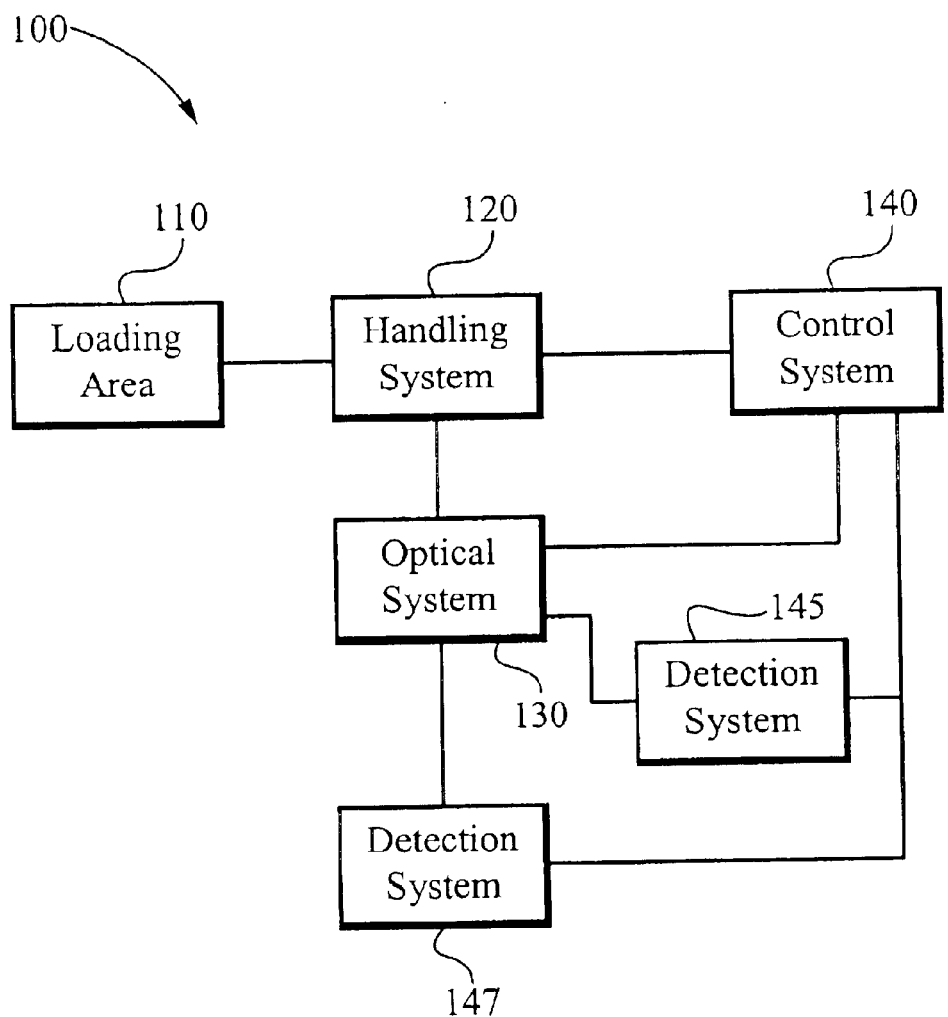
FIG. 2 illustrates a block diagram of a testing system according to the preferred embodiment of the present invention.

In FIG. 2, a preferred embodiment of the automated testing system of the present invention is illustrated. Same elements will use the same numerals throughout FIGS. 1–9. A testing system 100 comprises a loading area 110, a handling system 120, an optical system 130, a control system 140, a detection system 145, and a detection system 147. The laser diode sub-assemblies to be tested are placed by a user in the loading area 10. Since most vertical cavity surface emitting laser (VCSEL) laser diode sub-assemblies are manufactured using the COP configuration, hereinafter the term COP is used to refer to the laser diode sub-assembly being tested within the present invention. Preferably, the COPs are held in bars as used at wire bond, which are well known in the industry, with 10 COPs per bar. It should be clear that the number of COPs per bar is arbitrary and that the number of COPs per bar can be larger or smaller as desired. It should also be clear that holding devices other than bars can be used to place the COPs for test in the loading area.

The handling system 120 unloads each COP from the loading area 110, identifies the identification number of the COP, loads the COP into a collet in the transfer mechanism, transports the loaded COP to the optical system 130 to perform testing, unloads the COP from the transfer mechanism, verifies the identification number and loads the COP back into the loading area 110. The detection system 145 and the detection system 147 are each coupled to the optical system 130 for detecting laser light provided by the optical system 130. The detection system 145 and the detection system 147 are used to detect certain characteristics of the laser light provided by the optical system 130. The characteristics to be detected are determined by the nature of the test currently being performed. Preferably, the detection system 145 detects power output by the laser light, and the detection system 147 detects the spectrum of the laser light. It should also be clear that more or less detection systems can be used to determine other characteristics of the laser light.

The control system 140 is coupled to the handling system 120, the optical system 130, and each of the detection systems 145 and 147. The control system 140 receives position status information related to the current positions of each COP within the testing system 100. The position status information is provided by the handling system 120 and the optical system 130 through the use of sensors. The detection systems 145 and 147 are not co-operative, that is the laser light is not directed to each detection system simultaneously. Preferably, only one of the detection systems 145 and 147 is receiving the laser light at a given time. When the detection system 145 or 147 is detecting the laser light, the characteristics measured by the particular detection system are continuously sent to the control system 140. The control system 140 processes the received position status information and the received detected characteristics, and sends appropriate control instructions to the handling system 120, the optical system 130, and the detection systems 145 and 147. The details of these control instructions will be discussed in greater detail below.

Figure 3:
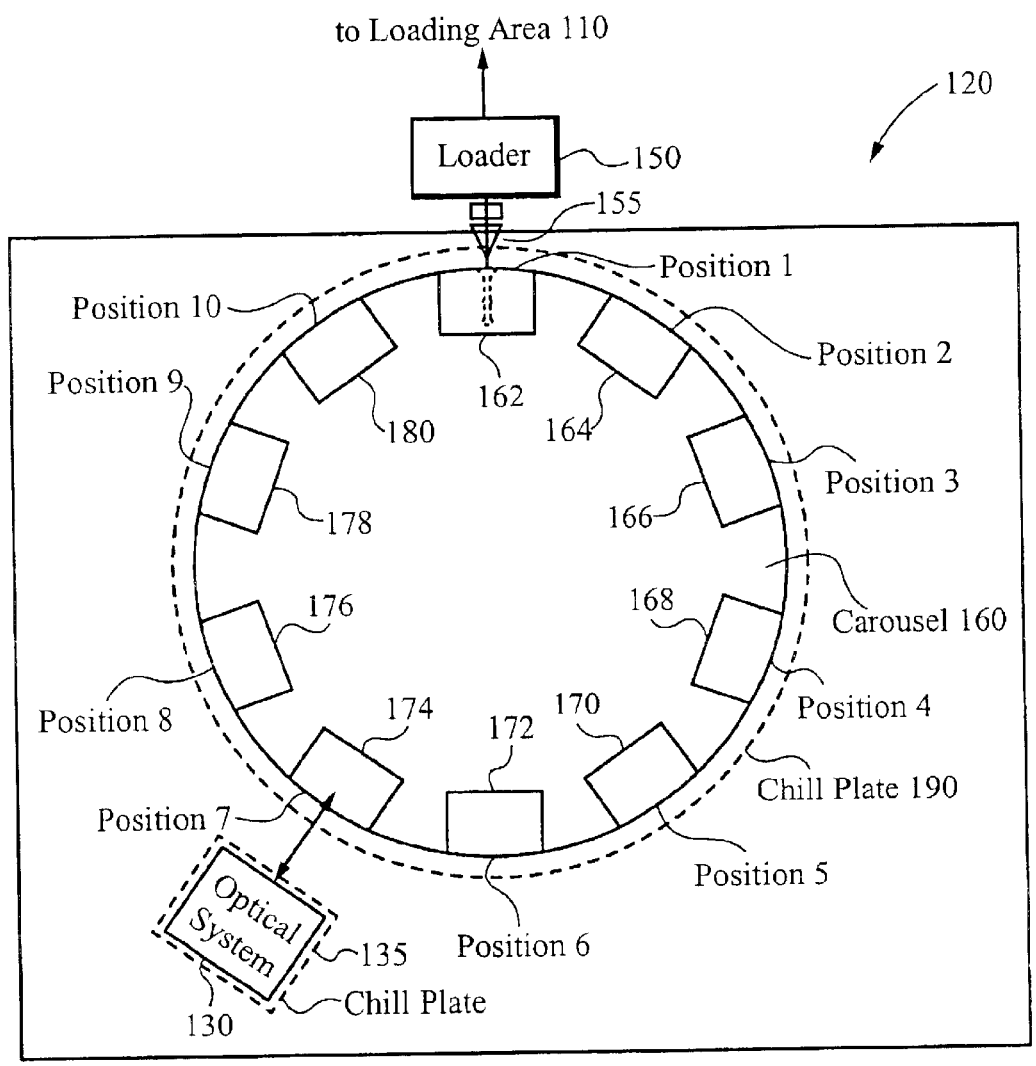
FIG. 3 illustrates the handling system of the present invention.

FIG. 3 illustrates the preferred embodiment of the handling system 120. The handling system 120 includes a loader 150, a carousel 160, and a chill plate 190. The loader 150 includes a loading jaw to grasp and remove each COP from the bars placed in the tray. Preferably, the tray is positioned within the loading area 110 according to specific location specifications. As such, it is anticipated by the handling system 120 that each COP within the bar is located at a precise location. The loading jaw is programmed to move to one of these precise locations where it expects to locate a COP. Alternatively, position sensors are utilized to determine the exact positions of each bar and the current position of the loading jaw and pickup head. Using the position information, the control system 140 provides control instructions to instruct the pickup where to go in order to locate the next COP within the bar.

Upon removing the COP from the tray, a detector verifies that the tab is attached and correctly oriented on the COP. The loading jaw then carries the COP to the carousel 160 along a determined path. Preferably, a two-dimensional matrix camera is positioned along the determined path. As the COP is carried along the determined path, the camera scans the bottom of the COP for identification purposes. One conventional method of identification is bar codes, yet the bottom surface area of a COP is insufficient to accommodate the use of bar codes. Instead, each COP is preferably manufactured using an identification method, specified as a two-dimensional matrix code using a laser to mark the pattern of unequally placed dots. Each image pattern represents a unique identification tag for each COP. The series of dots is placed on the bottom surface of each COP such that as each COP is carried over the camera along the determined path, the image pattern is scanned and its unique identification tag identifies the COP. Conventionally, COPs are difficult, if not impossible, to track once they have been removed from a tray. Previously, individual COPs or any subassembly have not included identification markings and as such are tracked by their relative position within a carrier. If the COP is accidently, or inadvertently removed from the carrier, its identification, and corresponding known functionality, is lost. In such a case, the COP would need to be re-tested to determine its make, type, and whether or not it functions properly. Using the two-dimensional matrix image patterns incorporated by the present invention, individual COPs can be tracked independently throughout the entire assembly and testing process.

Figure 4A:
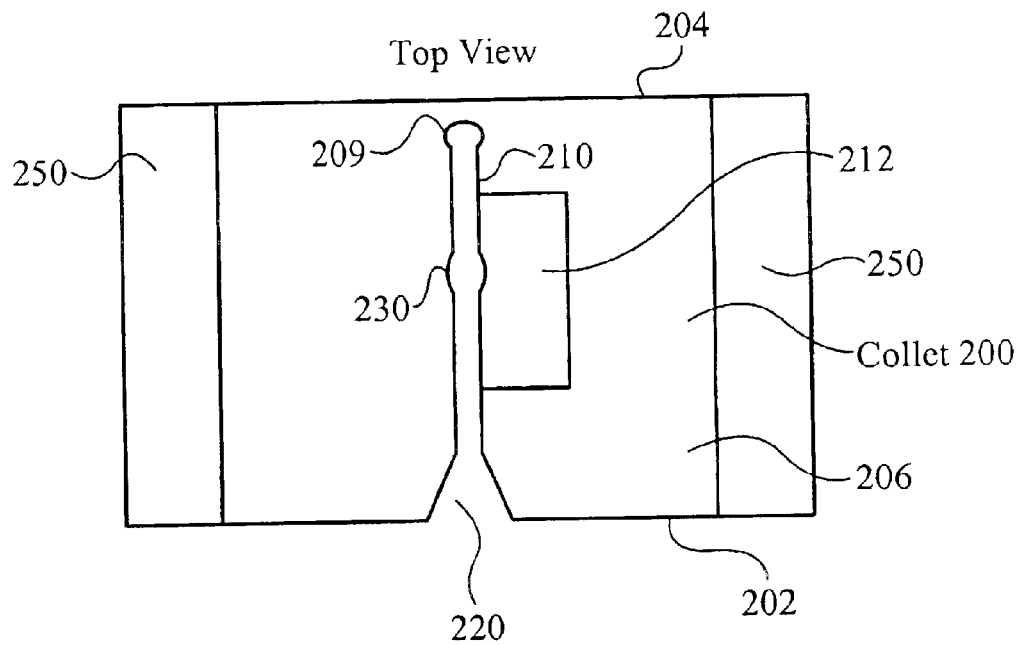
FIG. 4A illustrates a top view of a collet according to a preferred embodiment of the present invention.
Figure 4B:
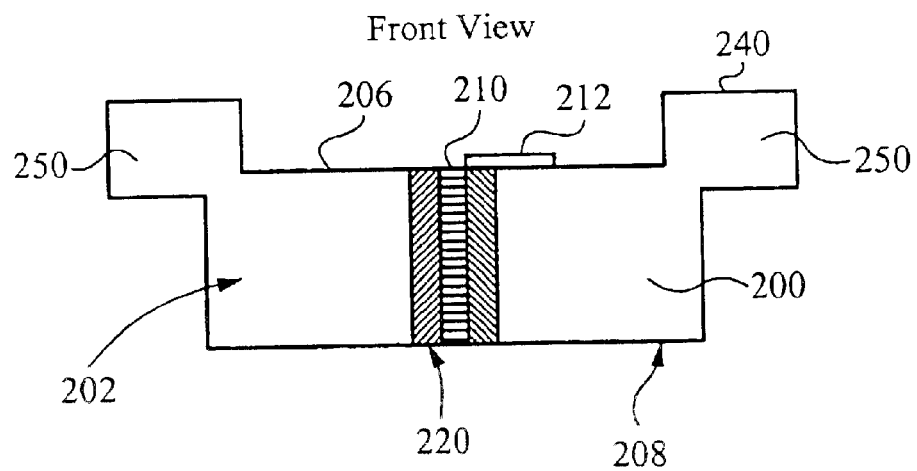
FIG. 4B illustrates a side front view of the collet according to a preferred embodiment of the present invention.

The carousel 160 includes a plurality of loading nests. Preferably, there are ten nests 162–180 in the carousel 160, although it should be clear that design constraints of the testing system 100 can dictate the use of more or less nests as necessary. Each nest 162–180 is configured to accept a collet 200, as illustrated in FIGS. 4A and 4B. FIG. 4A illustrates a preferred embodiment of a top view of the collet 200. FIG. 4B illustrates a preferred embodiment of a front side view of the collet 200. The collet 200 acts to accurately position the COP, essentially acting as a carrier for each COP within the testing system 100. Preferably, the collet 200 is made of beryllium copper. Beryllium copper provides advantages over conventional aluminum securing devices and has a long and valued history as the contactor of choice in many testing applications. Beryllium copper is extremely tough, stronger than stainless steel, so it offers good wear, has excellent resistance to warpage or being bent out of shape and retains its spring properties over a wide range of temperatures and conditions. Beryllium copper also provides excellent electrical characteristics and provides a high thermal coefficient to efficiently dissipate heat. In this invention, the use of beryllium copper in the configuration shown, allows loading and unloading of the COP without the need for screws or clamps to maintain electrical and thermal contact. Conventionally, devices used to secure a COP in place have been made of aluminum. However, aluminum is too soft and too corrosive to provide an adequate lifetime for use in an automated system. The beryllium copper is preferably formed into a flat square block. A channel 210 extends vertically through the block from a top surface 206 to a bottom surface 208, and the channel extends horizontally through the block starting from a front surface 202, past a center of the block and terminating before a back surface 204. The channel extends along a path that bisects the block along a vertical plane perpendicular to the front surface 202. The channel includes a wedge-shaped opening 220 located at a front end of the channel 210 starting at the front surface 202. The channel also includes a closed end 209 located at a back end of the channel 210, where the closed end 209 lies along the bisecting path between the center of the block and the back surface 204. A precision hole is drilled at the closed end to obtain the proper closing force.

A positioning hole 230 extends from a top center portion of the top surface 206 through the block to a bottom center position of the bottom surface 208. The positioning hole is perpendicular to the top surface 206. Preferably, the positioning hole 230 is cylindrical and conforming in shape to the COP. It should be clear that the positioning hole 230 can be a shape other than cylindrical, for example rectangular or trapezoidal, where the shape of the positioning hole conforms to the shape of the device under test to be positioned within the collet 200. The positioning hole 230 includes a top portion and a bottom portion, each portion having a different diameter. A diameter of the top portion is larger than the width of the channel and the diameter of the top portion is equal to a diameter of the COP. A diameter of the bottom portion of the positioning hole 230 is smaller than the diameter of the top portion yet large enough to permit a plunger to move through. In this manner the bottom portion acts as a counter bore within the positioning hole 230 of the collet 200. Depending upon the COP configuration, this counterbore can act as a stop when the COP is lowered into the positioning hole 230. The length of the top portion is sufficiently long as to position the COP within the positioning hole 230 such that the bottom surface of the COP rests above the bottom portion of the positioning hole 230 and a top surface of the die of the COP rests above the top surface 206 of the block. The distance that the top surface of the COP is above the top surface 206 is sufficient to permit the tab 30 to extend above the top surface 206 and rest on top of an insulating Torlon plate 212. The torlon plate 212 is positioned on top of the top surface 206 and acts as an insulator as well as depth-positioning device locating the top of the post even with the top surface 206 of the collet. When power is applied, one polarity is coupled to the tab 30 of the COP during test, the torlon plate 212 to insulates the tab 30 from the collet 200, and the other polarity is coupled via the thermal plate to the bottom of the collet.

The collet 200 preferably includes two collet wings 250 on the two top sides that guide and serve as highly accurate positioning surfaces, but not the front side 202 or the back side 204, of the collet 200. The collet 200 is designed to be loaded and unloaded into and out of the nests 162–180 of the carousel 160. Preferably, the collets are slid in and out of the nests 162–180 with the carousel 160 in a raised position. While sliding, contact is made between the collet 200 and the sides of the nest. To minimize wear on the collet 200, especially the bottom surface 208, the collet wings 230 provide the contact point between the collet 200 and the sides of the nest as well as the test site.

In a standard position, the channel 210 of the collet 200 has a uniform width, and the positioning hole 230 has a standard diameter. To load the collet 200 with the COP, a wedge 155 (FIG. 3) is placed in the wedge-shaped opening 220 and pressure is applied to the wedge. Pressure to the wedge pushes the wedge into the wedge-shaped opening 220 thereby forcing open the wedge-shaped opening 220. Consequently, the channel 210 and the positioning hole 230 are also expanded. Preferably, the diameter of the positioning hole 230 expands 0.006 inches over its standard diameter, although expansion of as much as 0.008 inches over the standard diameter is possible. Clearly, the exact amount that the positioning hole is expanded is not restrictive; however, it is necessary that the positioning hole 230 is sufficiently expanded as to permit the COP to be loaded into the positioning hole 230, but not expanded too far as to expand the diameter of the bottom portion of the positioning hole 230 greater than the diameter of the COP. The amount of the expansion is dependent upon the wedge travel, air pressure applied and the limits imposed by the nests in the carousel. The advantage of the wedge design is that it compensates for any wear at the interface of the wedge and the collet and continues to move inward to open the collet the proper amount. Once the COP is loaded into the positioning hole 230, the wedge 155 is removed from the wedge-shaped opening 220 and the diameter of the positioning hole 230 returns to its standard diameter, thereby securing the COP in place within the positioning hole 230. The resiliency and strength of beryllium copper is particularly useful in this regard as it eliminates the need for any screws or clamps.

The wedge 155 is used to open the collet 200 and to precisely locate the collet 200 for loading and unloading of the collet. The wedge design is such that it automatically compensates for any wear of the wedge or the wedge opening as opening is controlled by the air pressure supplied to the wedge cylinder and the sides of the nests in the carousel. The force of the collet on the device is controlled by the thickness of the material, the width of the slot, the length of the slot and the position and diameter of the hole at the closed end of the slot.

To remove the COP from the collet 200, the loading jaws are positioned around the COP, the wedge is reapplied to the wedge-shaped opening 220 to expand the positioning hole 230, and a plunger is extended up through the bottom of the collet 200 through the bottom portion of the positioning hole 230. The plunger pushes the COP high enough for the loading jaws to grasp the post 10 of the COP below the tab 30. It is important that the loading jaws do not grasp the COP by the die 20 or by the tab 30 as this would most likely damage the device.

The dimensions of the positioning hole 230 are relative to the configuration of the device under test. The dimensions of the channel 210 and the hole at the rear of the slot are relative to the required pressure applied to the device under test by the collet while the device is in the positioning hole 230 in order to secure the device under test in place. The length of the channel 210 can be variable in length. The shorter the channel 210, and consequently the longer the section of beryllium copper between the closed end 209 and the back surface 204, the greater the pressure applied to the device under test within the positioning hole 230. Conversely, the longer the channel 210, and consequently the shorter the section of beryllium copper between the closed end 209 and the back surface 204, the lower the pressure applied to the device under test within the positioning hole 230. Applying pressure in this manner allows the collet 200 to effectively clamp the COP into position, where the length of the channel 210 establishes a consistent level of clamp force. Conventionally, clamping force on the COP is variably applied through the manual application of screws and clamps by individuals of varying degrees of strength. The clamp force applied through the collet of the present invention eliminates this variation in clamp force since the amount of clamp force is preset at the time of manufacture of the collet and remains throughout the life of the collet with minimal change in pressure.

The collet design of the present invention also maximizes heat dissipated from the COP during testing. Since the positioning hole 230 is configured to match the configuration of the COP, the surface area of the collet that is in contact with the COP is equal to 360 degrees less the width of the channel 210 on either side of the positioning hole 230. The larger the contact surface area between the collet and the COP the greater the ability of the collet to dissipate the heat generated by the COP during testing. This is a highly desirable attribute. In addition, the collet is pancake-shaped to provide maximum heat dissipation as rapidly as possible from the COP to the thermal controller.

The testing system 100 is capable of testing devices of varying sizes. To change a type of device handled by the testing system 100, the existing collets are replaced with new collets with the holes commensurate in size and geometry with the new device type. In this manner, different collets corresponding to different device types and sizes can be used without any change to the handling or optical system.

Referring back to FIG. 3, preferably a chill plate 190 is positioned underneath the carousel 160. The chill plate 190 is preferably made of aluminum. The thickness of the carousel nest 160 is designed such that the bottom surface 208 of each collet 200 within the carousel 160 is lower than a bottom surface of the carousel 160. While the carousel 160 is stationary for testing, loading or unloading, the carousel 160 is lowered until the bottom surfaces of each of the collets rest against the chill plate 190. Once the collets are in contact with the chill plate 190, the carousel 160 is clamped in place by reversing air to two air cylinders that are used to raise the carousel 160. The temperature of the chill plate 190 is preferably controlled by two thermo electronic controllers (TECs) that are under the control of the control system 140. Preferably, under each TEC is a heat sink augmented by a water chiller. The carousel 160 incrementally rotates through 10 fixed positions, positions 1–10. FIG. 3 illustrates an arbitrary snapshot of the carousel 160 in one of these positions. In FIG. 3, the nest 162 is positioned at position 1, the nest 164 is positioned at position 2, and so. At a point after a COP has been loaded into the collet 200 within the nest 162, the carousel 160 is rotated one position. After this one position rotation, the nest 162 is located at the position 2, the nest 164 is located at the position 3, and so. The carousel 160 rotates by raising up slightly, preferably only a few thousands of an inch to restrict any air flow that could affect temperature, rotating one position, and lowering back down again. Once lowered the carousel 160 is again clamped against the chill plate 190 such that all collets within the nests 162–180 make physical contact with the chill plate 190. Preferably, the carousel 160 is lifted and lowered using air actuators under the control of the control system 140. Other conventional lifting means can also be used to raise and lower the carousel 160.

The chill plate 190 is designed to thermally condition each COP secured within the collets before the COP reaches the optical system 130. Sensors are mounted on the chill plate 190 to monitor the temperature. Preferably, the optimal temperature of the chill plate 190 is 25 degrees Celsius with a tolerance of plus or minus 2 degrees. Sensors on the chill plate 190 send the temperature information to the control system 140, which in turn sends control instructions to the two TECs attached to the underneath of the chill plate 190 to regulate the temperature as appropriate.

The carousel of the present invention provides advantages over conventional rotary tables. Conventional rotary tables use an index and pin method to maintain accuracy. When the rotary table is rotated, a gear rotates the rotary table through a prescribed distance and a pin then locks the rotary table in place at each position. This verifies the position of the rotary table at each position. Such an arrangement is big, complex, and costly. In contrast, the carousel of the present invention, although clamped to the chill plate for thermal conditioning, is only locked into place at one of the ten positions. The locking point is at the home position 1. When the wedge is applied to the wedge-shaped opening 220 of the collet during loading, the collet, located at the home position 1 is very accurately positioned by the pressure and dimensions of the wedge. This accurate positioning maximizes accuracy of loading the COP into the collet. Referring to FIG. 3, at the position 7, the collet located in the nest 174 is to be moved from the carousel 160 to the optical system 130. To move the collet, the collet is slid from the carousel 160 into the optical system 130 with an air cylinder. Proper alignment of the nest 174 and the optical system 130 is not critical in enabling this movement. The collet is moved into the optical site along a precision hardened track and is pushed against a set of precision stop pins located in the track to set the Y position. A spring in the track forces the collet to one side to obtain the proper X position. The test site chill plate 135 is then raised via four air cylinders which raise the test site chill plate, the heat sink and the collet as a unit. The precisely machined top 240 of the wings 250 of the collet 200 are forced and held in place against the bottom edges of the precision track and one side. The air cylinder then pulls back, allowing the chill plate to maintain mechanical, thermal and electrical contact.

Figure 5A:
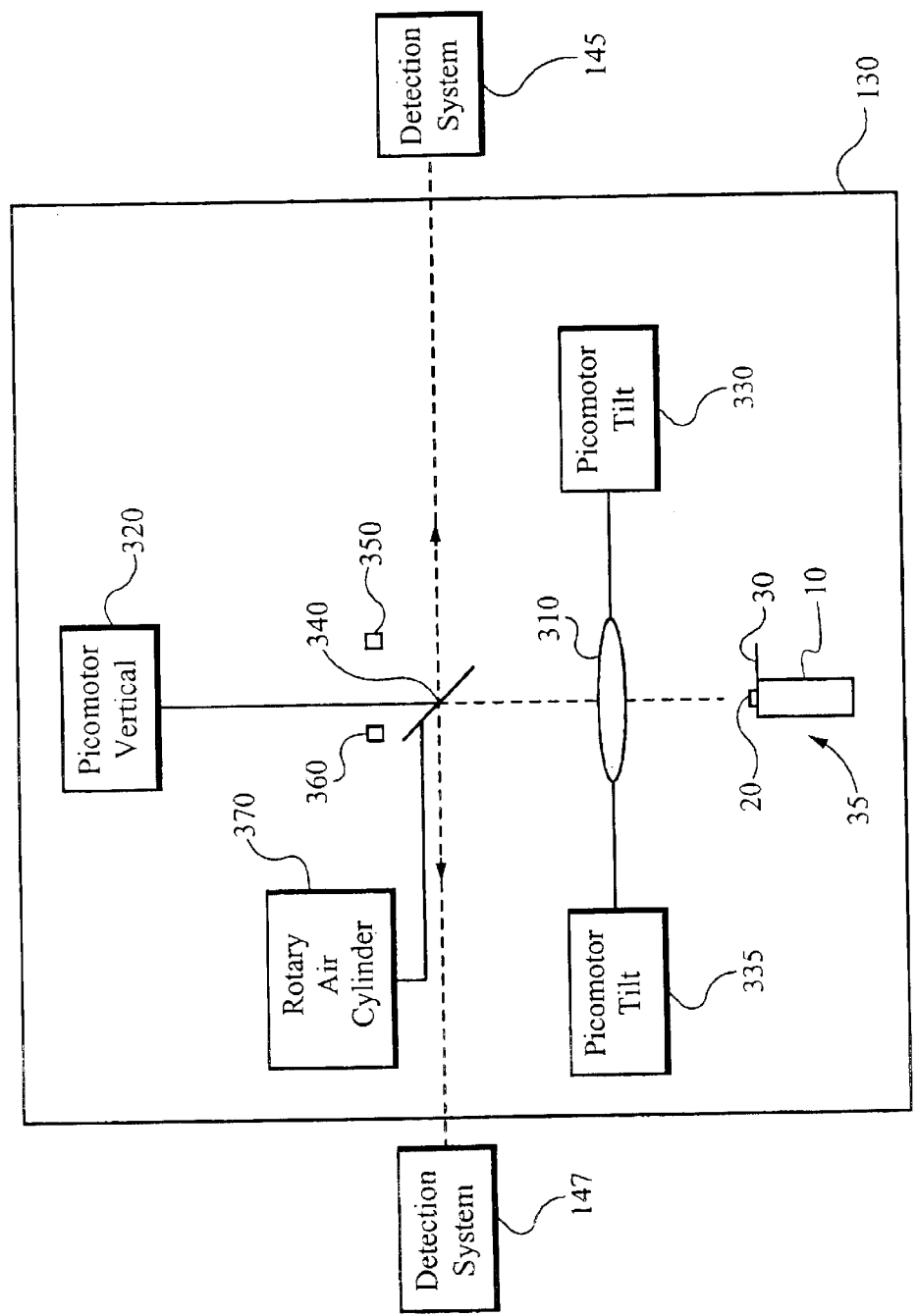
FIG. 5A illustrates a first portion of the optical system of the present invention used to align the lens and direct the laser light.
Figure 5B:
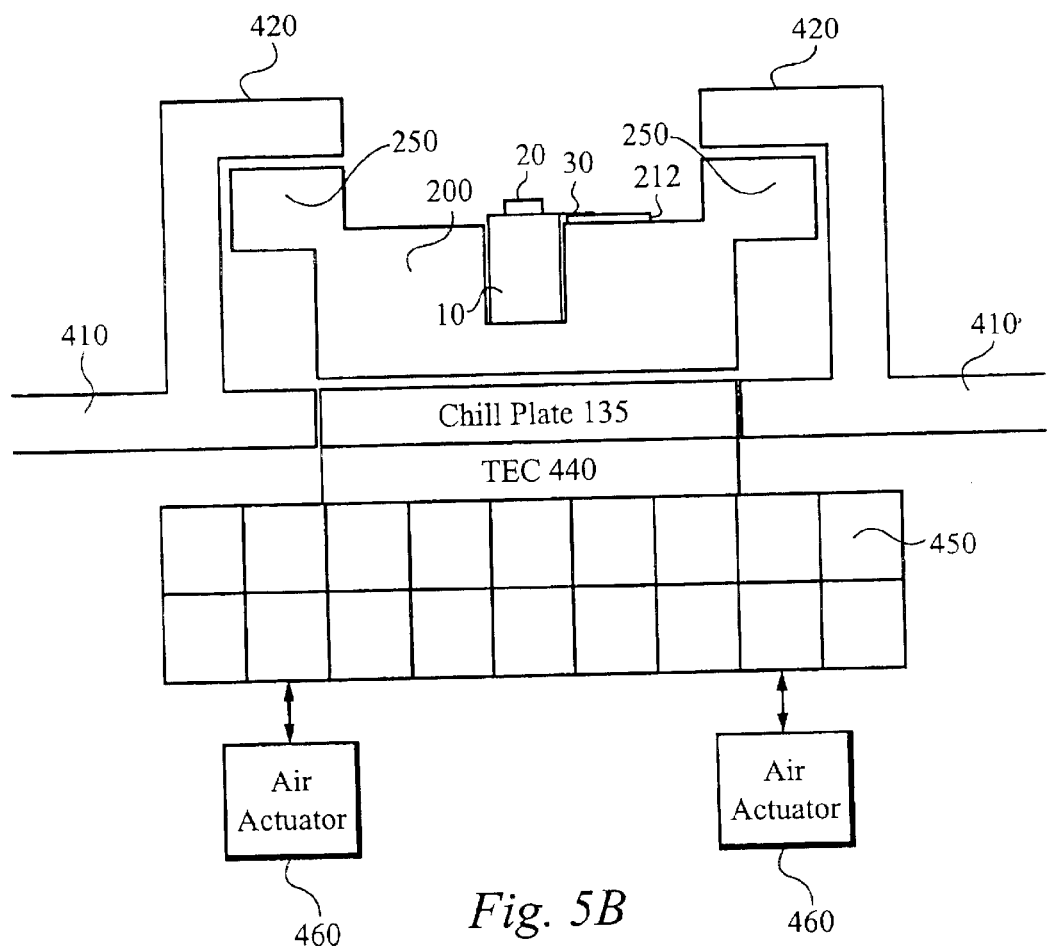
FIG. 5B illustrates a second portion of the optical system of the present invention used to secure the collet holding the device under test.

FIGS. 5A and 5B illustrate the preferred embodiment of the optical system 130 of the present invention. The optical system 130 is a self-contained, motorized, computer-controlled optics bench. While the optical system 130 is preferably used within the testing system 100 of the present invention, the optical system 130 can also be uncoupled from the handling system 120 and be used in a bench testing environment. In this case, a collet holding a device under test is loaded into the optical system 130.

FIG. 5A illustrates an upper section of the optical system 130. The optical system 130 includes a COP 35 comprising the post 10, the die 20 and the tab 30 as previously described. For simplicity, only the COP 35 is shown in FIG. 5A. It should be understood that the COP 35 is positioned within the collet 200, where the collet 200 is secured within the optical system 130 as will be described in relation to FIG. 5B below. The optical system 130 also includes a lens 310, a vertical picomotor 320, tilt picomotors 330 and 335, a mirror 340, two stops 350 and 360, and a rotary mirror air cylinder 370. The picomotors 320, 330 and 335 and the air cylinder 370 are under the control of the control system 140. The collet 200 with COP 35 is initially secured into the optical system 130 such that light emanating from the COP 35 is intersected by the lens 310. The lens 310 is coupled to the vertical picomotor 320 and to the tilt picomotors 330 and 335. As described above, conventional laser diode sub-assembly testing devices manually adjust the picomotors in order to properly align a lens for optimal laser light output. The lens 310 of the present invention is automatically adjusted by the computer-controlled vertical picomotor 320 and the tilt picomotors 330 and 335. The mirror 340 is positioned such that it intersects the laser light output from the lens 310. The mirror 340 is aligned at a predetermined angle to the intersecting laser light such that the mirror 340 directs the laser light to one of the detection systems 145 or 147. The one of the detection systems 145 or 147 that receives the directed laser light is determined by the test currently being performed. The mirror air cylinder 370 rotates the mirror 340 and the stops 350 and 360 act to properly align the mirror 340. As the detection system 145 is used to detect the necessary characteristics related to the power output of the laser light, when a power output test is to be performed, the mirror 340 is rotated counterclockwise by the mirror air cylinder 370 to rest against the stop 350. In this manner, the laser light output from the lens 310 is directed by the mirror 340 to the detection system 145. The detection system 145 detects data related to the power output characteristics of the laser light and sends the data to the control system 140. The control system 140 processes the received data from the detection system 145. Software within a computer of the control system 140 compares the received data against known expected results, and based on this comparison determines if and how the lens 310 should be moved. Movement of the lens 310 is translated into control instructions for the vertical picomotor 320 and the tilt picomotors 330 and 335. These control instructions are then sent by the control system 140 to the picomotors 320, 330 and 335. The vertical picomotor 320 moves the lens 310 up and down, while the tilt picomotors 330 and 335 tilt the lens 310 back and forth, similar to a seesaw. As the lens 310 is adjusted based on the received control instructions, the detection system 145 continually detects the desired characteristics and sends the data to the control system 140. The control system 140 continues to receive and compare the detected data with known expected results, and send control instructions to the picomotors 320, 330 and 335 in response. This iterative process continues until the lens 310 is placed in an optimal position. The optical system 130 also includes a series of limit switches to limit how far the auto-alignment process can move the lens up and down and back and forth. At the point where the optimal position of the lens 310 is reached, the power characteristics detected by the detection system 145 are sent to the control system 140. The control system 140 compares the power characteristics to previously input parameters. If the power characteristics fall within the parameters, the COP 35 currently under test passes the power test. If the power characteristics do not fall within the parameters, the COP under test fails the power test. Since each COP within the testing system 100 has been previously identified by its identification number, the power test results for each COP are saved and associated by the control system 140. In this manner, each COP and its associated test results can be tracked and sorted.

Once the power test is completed, the optical system is automatically initialized for the second device test, the spectrum test. To initialize the optical system 130, the control system 140 sends control instructions to the rotary mirror air cylinder 370 to rotate the mirror 340 clockwise until it rests against the stop 360. In this manner, the laser light from the lens 310 is directed by the mirror 340 to the detection system 147. The spectrum characteristics are detected by the detection system 147 and are sent to the control system 140. The control system 140 compares the spectrum characteristics to previously input parameters. If the spectrum characteristics fall within the parameters, the COP 35 currently under test passes the spectrum test. If the spectrum characteristics do not fall within the parameters, the COP under test fails the spectrum test. The spectrum test results for each COP are saved and associated by the control system 140.

Although the previous process has been described by performing the power test first and the spectrum test second, it should be clear that the order in which the tests are performed is not critical, and the tests can be performed in any order. Preferably, the power test and the spectrum test are performed for each COP 35, even if the COP 35 fails the first test. However, the testing system 100 can be programmed to skip the second test if the COP 35 fails the first test. It should also be clear that the picomotors 320, 330 and 335 can be replaced by any conventional means of finely incrementing the position of the lens 310. Similarly, the rotary mirror air cylinder 370 can be replaced by any conventional means for rotating the mirror 340.

In operation, the optical system 130 requires no user input, nor in the preferred embodiment is user input allowed. The optical system 130 can also be used independently of the automated testing system 100, for example within a QA system or bench testing, where the loading and unloading of the optical system 130 is performed manually. The optical system 130 can also be used for other auto-alignment functions, for example properly aligning and attaching fiber optics to a laser diode sub-assembly. The optical system 130 can use all standard lens holders to perform auto-alignments using various types and sizes of lenses.

FIG. 5B illustrates a bottom section of the optical system 130 used to secure the collet 200 into place within the optical system 130. The bottom section includes a chill plate 135, a TEC 440, a heat sink 450, and air actuators 460. The chill plate 135 is preferably made of beryllium copper. The entire bottom surface of the chill plate 135 is in contact with the TEC 440, and the TEC 440 is in contact with the heat sink 450. The chill plate 135 is laterally held in place by stainless steel supports 410 positioned on both sides of the chill plate 135. From each support 410, a rail 420 vertically extends from the support 410 and protrudes over the chill plate 135. The rails 420 are positioned to permit the collet 200 to slide underneath the rails 420 when the collet 200 is slid into position within the optical system 130 by the handling system 120. In particular, the rails 420 protrude sufficiently to overlap the collet wings 250. The rails 420 include pins on the back portion so that when the collet 200 is slid into position during loading from the handling system 120 to the optical system 130, the back surface 204 of the collet 200 is secured against the rail pins. Once the collet 200 is secured against the rail pins, the heat sink 450 is raised by the air actuators 460. The air actuators 460 move in response to control instructions received from the control system 140. The heat sink 450 forces the chill plate 135, by way of the TEC 440, against the bottom surface 208 of the collet 200. As a result, the collet 200 is moved up until the collet wings 250 are pushed against the underside of the rails 420. This secures the collet 200 in place against the rails 420 and the chill plate 135. Since the collet 200 is secure against the rail pins as well, the position of the collet 200 within the optical system 130 is known. The undersurface of the rails 420 is a known location by the control system 140. As the dimensions of the collet 200 are also known, the control system 140 knows precisely the location of the top surface 206 of the collet 200. Since the position of the COP within the collet 200 is known, due to sensor readings during loading of the COP into the collet 200, the COP position within the optical system 130 is also precisely known.

Sensors are located on the chill plate 135 to send temperature data to the control system 140. The TEC 440 receives control instructions from the control system 140 to control the temperature of the chill plate 135 within a determined tolerance. The supports 410 are preferably made of stainless steel due to the low heat conduction of stainless steel. Therefore, when the temperature of the chill plate 135 is set within tolerance, the stainless steel support 410 does not introduce additional heat from outside the optical system 130 and does not transmit heat from the chill plate 135 out of the optical system 130. The stainless steel acts as an insulator as well as a support. The bottom surface 208 of the collet 200 and the top surface of the chill plate 135 are preferably flat to maximize the surface contact area between the two and therefore maximize heat dissipation. The chill plate 135 is preferably made of beryllium copper. A top surface of the TEC 440 is in contact with the chill plate 135 and a bottom surface of the TEC 440 is in contact with the heat sink 450. As power is applied to the COP 35 during testing, heat is produced within the COP 35. As the heat generated increases, the collet 200 acts to dissipate the heat from the COP 35. In turn, heat dissipates from the collet 200 to the chill plate 135, from the chill plate 135 to the TEC 440, and finally from the TEC 440 to the heat sink 450. As more heat is generated by the COP 35 and dissipated through the collet 200, more heat is pulled away from the collet 200 by the chill plate 135. To match the increase of heat in the chill plate 135, the TEC 440 increases cooling capacity to match the increase in temperature of the chill plate 135. Such a configuration results in a closed loop system between the collet 200, the chill plate 135, the TEC 440, and the heat sink 450. In this manner, temperature at the test site, i.e. the COP 35, is very accurately controlled.

Once testing is complete, power applied to the COP 35 is turned off. The air actuators 460 are lowered thereby releasing the collet 200 from its secured position within the optical system 130. The collet 200 is then removed from the optical system 130 by the handling device 120.

Figure 6:
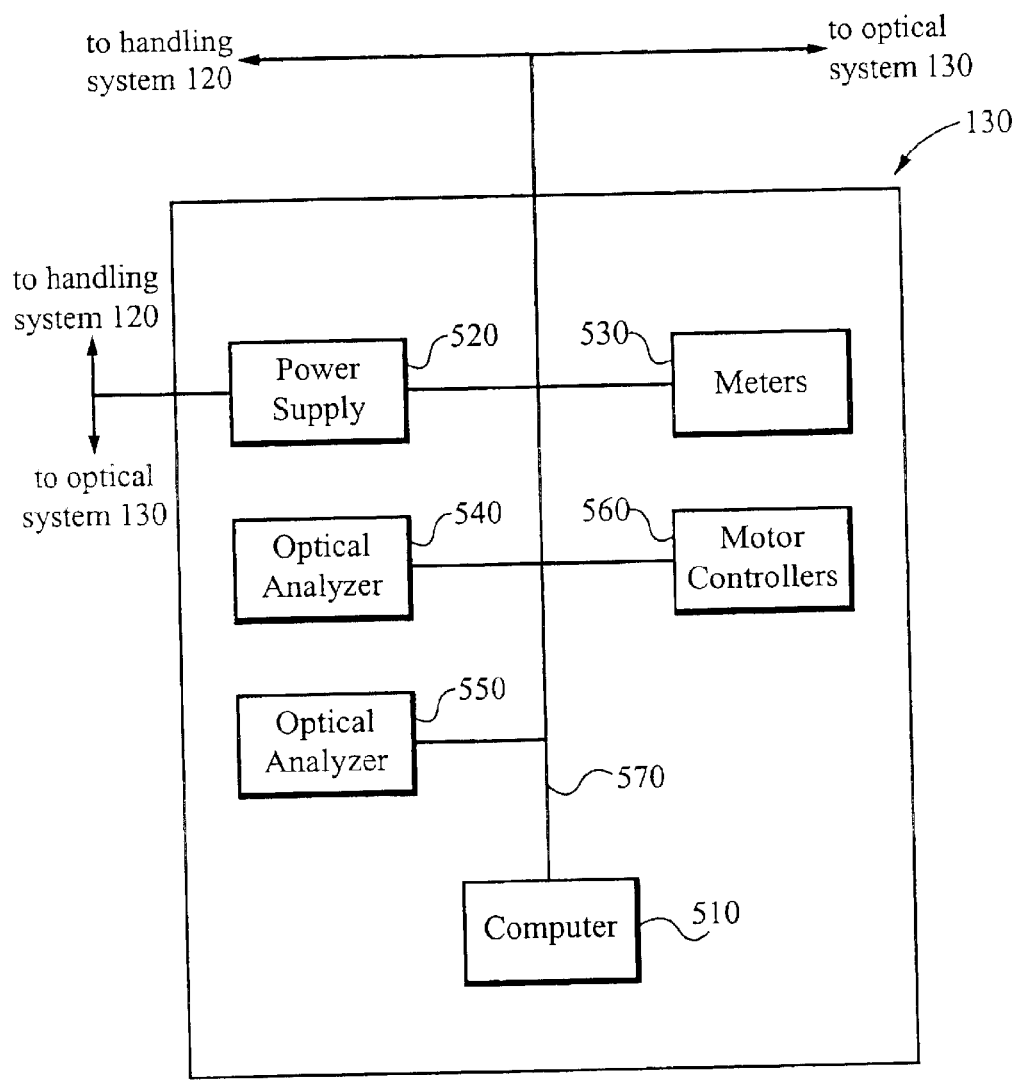
FIG. 6 illustrates a block diagram of the internal components of the control system of the present invention.

FIG. 6 illustrates the preferred embodiment of the control system 130. The control system includes power supply 520, meters 530, an optical analyzer 540, an optical analyzer 550, motor controllers 560, and a computer 510 all coupled together by a bi-directional system bus 570. The power supply 520 includes individual power supplies for the two TECs coupled to the chill plate 190 underneath the carousel 160, the TEC 440, the COP 35 during testing within the optical system 130, sensors within the testing system 100, and the air actuators 460. The meters 530 are preferably 4-terminal measurement meters for voltage and ampere readings of the COP 35 during testing. The optical analyzer 540 and the optical analyzer 550 are conventional analyzers used to receive the detected data from the detection devices within the detection systems 145 and 147, respectively. In the preferred embodiment, one optical analyzer corresponds to each detection system. In the preferred case where two detection systems 145 and 147 are present to detect results from two different tests performed, the power test and the spectrum test, respectively, two corresponding optical analyzers 540 and 550 are used. In the case where more or less detection systems are used, a corresponding number of optical analyzers will preferably be used within the control system 130.

The motor controllers 560 include controllers for motors and/or air solenoids which operate the carousel 160, the loader 150, the loading mechanism that slides the collet 200 from the handling system 120 into and out of the optical system 130, the picomotors 320, 330, and 335 and the rotary air cylinder 370 within the optical system 130. The computer 510 includes the software to properly determine the control instructions to be sent to the various elements within the testing system 100. The computer 510 receives input data including analyzed data from the optical analyzers 540 and 550, and data from the sensors. In response to the input data, the computer sends control instructions for proper operation of the testing system 100.

Figure 7:
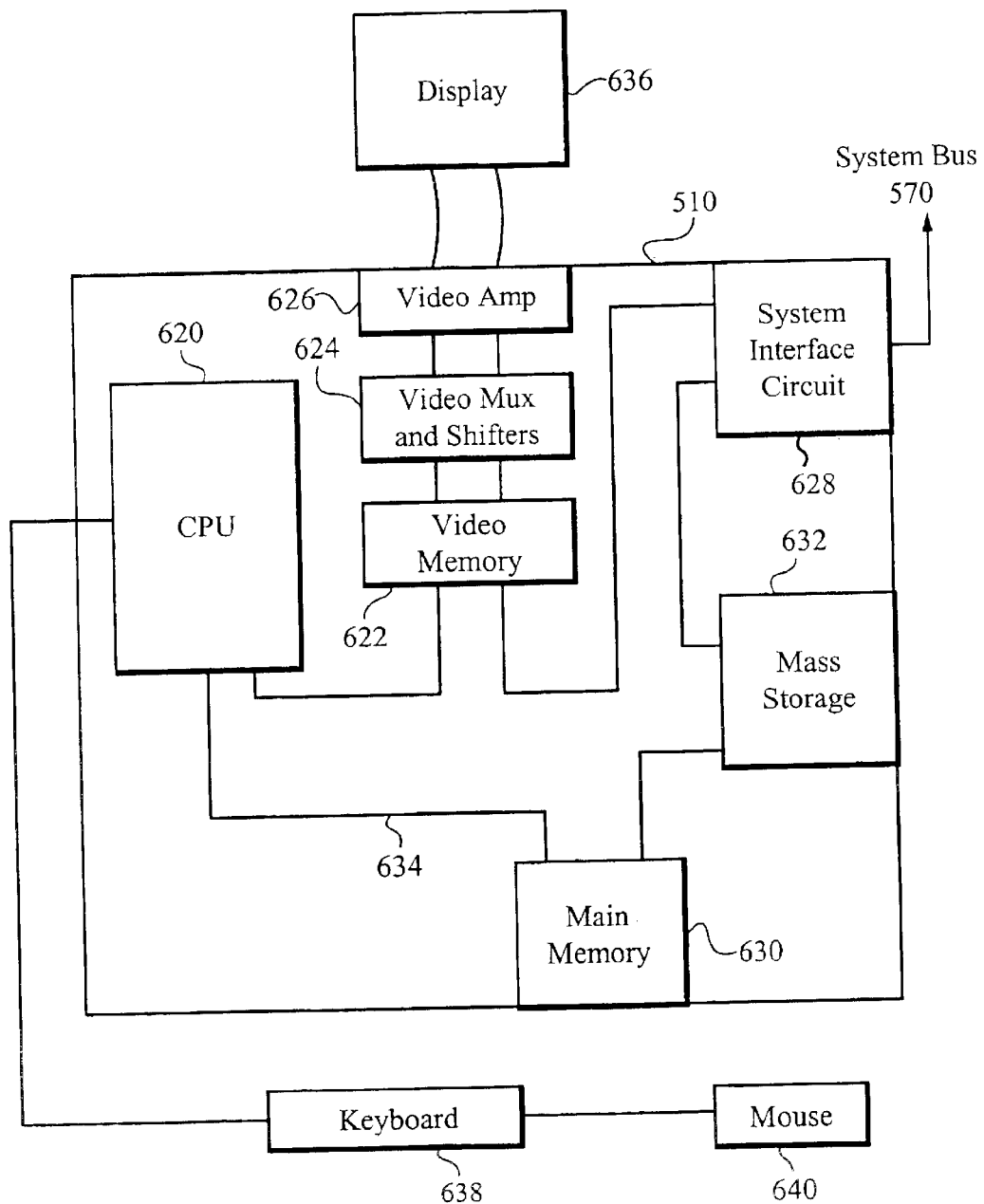
FIG. 7 illustrates a block diagram of the internal components of exemplary computer used within the control system of the preferred embodiment of the present invention.

FIG. 7 illustrates a block diagram of the internal components of an exemplary computer 510 used within the control system 140 of the preferred embodiment of the present invention. The computer 510 includes a central processor unit (CPU) 620, a main memory 630, a video memory 622 and a system interface circuit 628, all coupled together by a conventional bidirectional system bus 634. The interface circuit 628 is coupled to the system bus 570. Within the computer 510, the interface circuit 628 is coupled to a mass storage device 632.

The mass storage device 632 may include both fixed and removable media using any one or more of magnetic, optical or magneto-optical storage technology or any other available mass storage technology. The system bus 634 contains an address bus for addressing any portion of the memory 622 and 630. The system bus 634 also includes a data bus for transferring data between and among the CPU 620, the main memory 630, the video memory 622 and the interface circuit 628.

The computer 510 is also coupled to a number of peripheral input and output devices including a keyboard 638, a mouse 640 and an associated display 636. The keyboard 638 is coupled to the CPU 620 for allowing a user to input data and control commands into the computer 510. A conventional mouse 640 is coupled to the keyboard 638 for manipulating graphic images on the display 636 as a cursor control device.

A port of the video memory 622 is coupled to a video multiplex and shifter circuit 624, which in turn is coupled to a video amplifier 626. The video amplifier 626 drives the display 636. The video multiplex and shifter circuitry 624 and the video amplifier 626 convert pixel data stored in the video memory 622 to raster signals suitable for use by the display 636.

Figure 8:
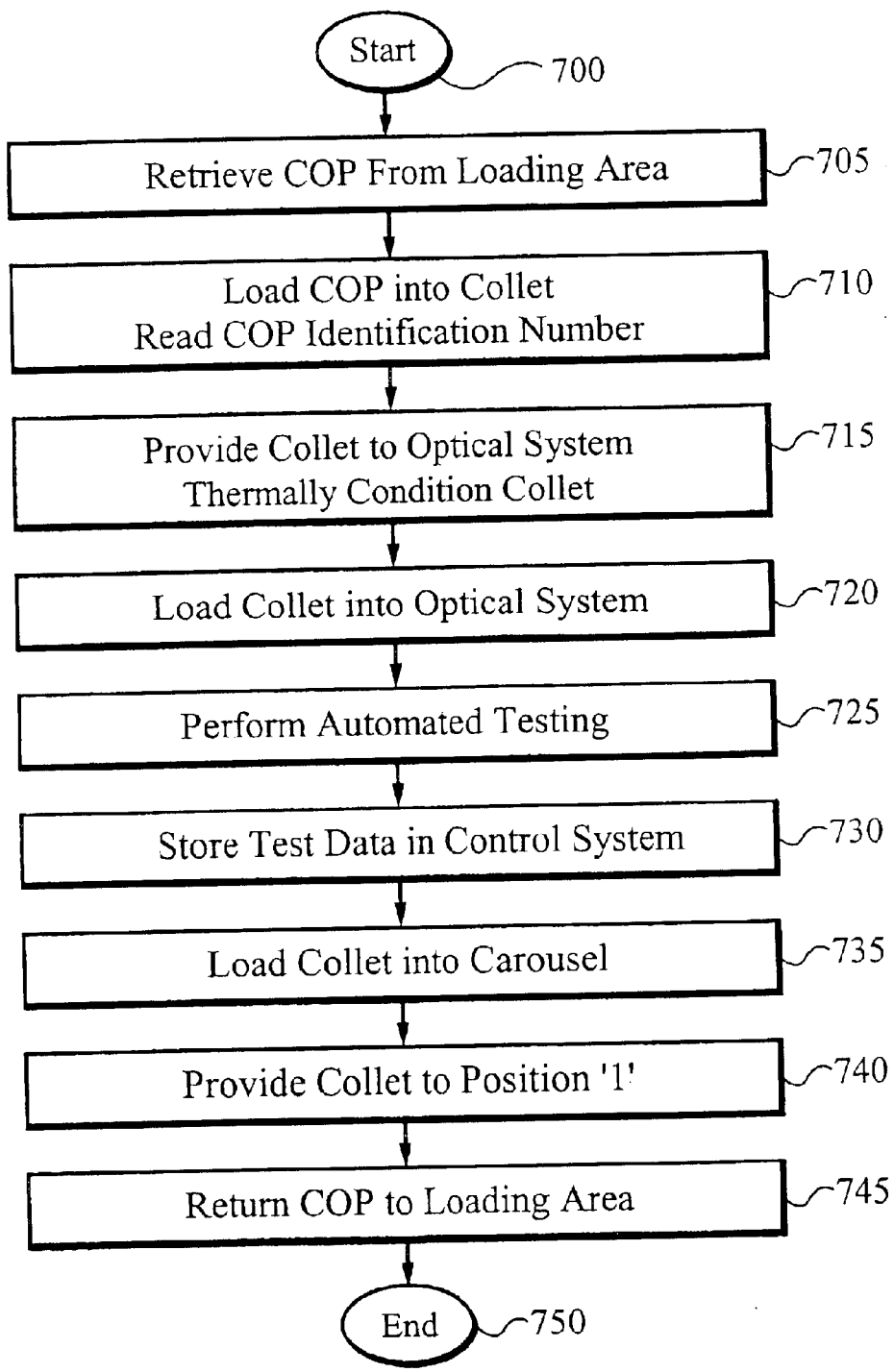
FIG. 8 illustrates a flowchart showing the automated process of the testing system of the present invention.

FIG. 8 illustrates a flowchart showing the automated process of the testing system 100 of the present invention. The automated process illustrated in FIG. 8 is described from the perspective of a single COP being moved though the testing system 100. It should be clear that while this single COP is moving from position to position, other COPs are simultaneously being processed by the testing system 100, only at different steps within the overall automated process. The automated process of the testing system 100 starts at the step 700. At the step 705, a COP is retrieved from the loading area 110 by the loader 150. At the step 710, the COP is loaded into the collet 200 at position 1. As the COP is carried by the loader 150 from the loading area 110 to the collet 200, the bottom of the COP passes over a two-dimensional matrix camera which identifies the particular COP being loaded. The position of the COP will be tracked throughout the testing system 100. The collet 200 into which the COP is loaded by the loader 150, is positioned within the carousel 160. At the step 715, the collet 200 is incrementally moved from position 1 to position 7. As the collet is moved from position 1 to position 7, the collet 200 stops at each position 2, 3, 4, 5 and 6. While moving from positions 1–7, the COP within the collet 200 is being thermally conditioned by the chill plate 190 underlying the carousel 160. Once the collet 200 is moved to position 7, at the step 720, the collet 200 is loaded into the optical system 130. Preferably, the collet 200 is slid into the optical system 130 by an air cylinder coupled to a push bar. The air cylinder receives control instructions from the control system 140, and in turn the air cylinder moves the sliding means to slide the collet 200 from the carousel 160 into the optical system 130.

At the step 725, the optical system automatically performs the tests on the COP. Preferably, the tests performed are the power test and the spectrum test as described above. At the step 730, the test results are stored and associated with the COP currently under test by the control system 140. The test results are associated to the COP by the COP identification previously determined by the two-dimensional matrix camera. The control system 140 tracks the position of the COP within the testing system 100. Since each step within the testing system 100 is known by the control system 140, the control system 140 tracks the exact location of each COP as each step is performed. At the step 735, the collet 200 is removed from the optical system 130 and returned to the nest in the carousel 160. The collet 200 is returned to the same nest within the carousel 160 from which the collet 200 was previously removed. The collet 200 is preferably slid from the optical system 130 to the carousel 160 by the air cylinder coupled to the unload bar. The air cylinder receives control instructions from the control system 140, and in turn the air cylinder and unload bar move the collet 200 from the optical system 130 into the carousel 160. At the step 740, the collet 200 is incrementally moved from position 7 to position 1. As the collet is moved from position 7 to position 1, the collet 200 stops at each position 8, 9 and 10. Once the collet 200 is moved to position 1, the COP is unloaded by the loader 150 and returned to the loading area 110. As the COP is carried by the loader 150 from the collet 200 to the loading area 110, the bottom of the COP again passes over the two-dimensional matrix camera to verify the identification of the COP being unloaded. As the position of the COP has been tracked throughout the testing system 100, this final identification serves to verify that the unloaded COP is the COP that the control system 140 expects to be unloaded. The automated process of the testing system 100 then ends at the step 750.

Figure 9A:
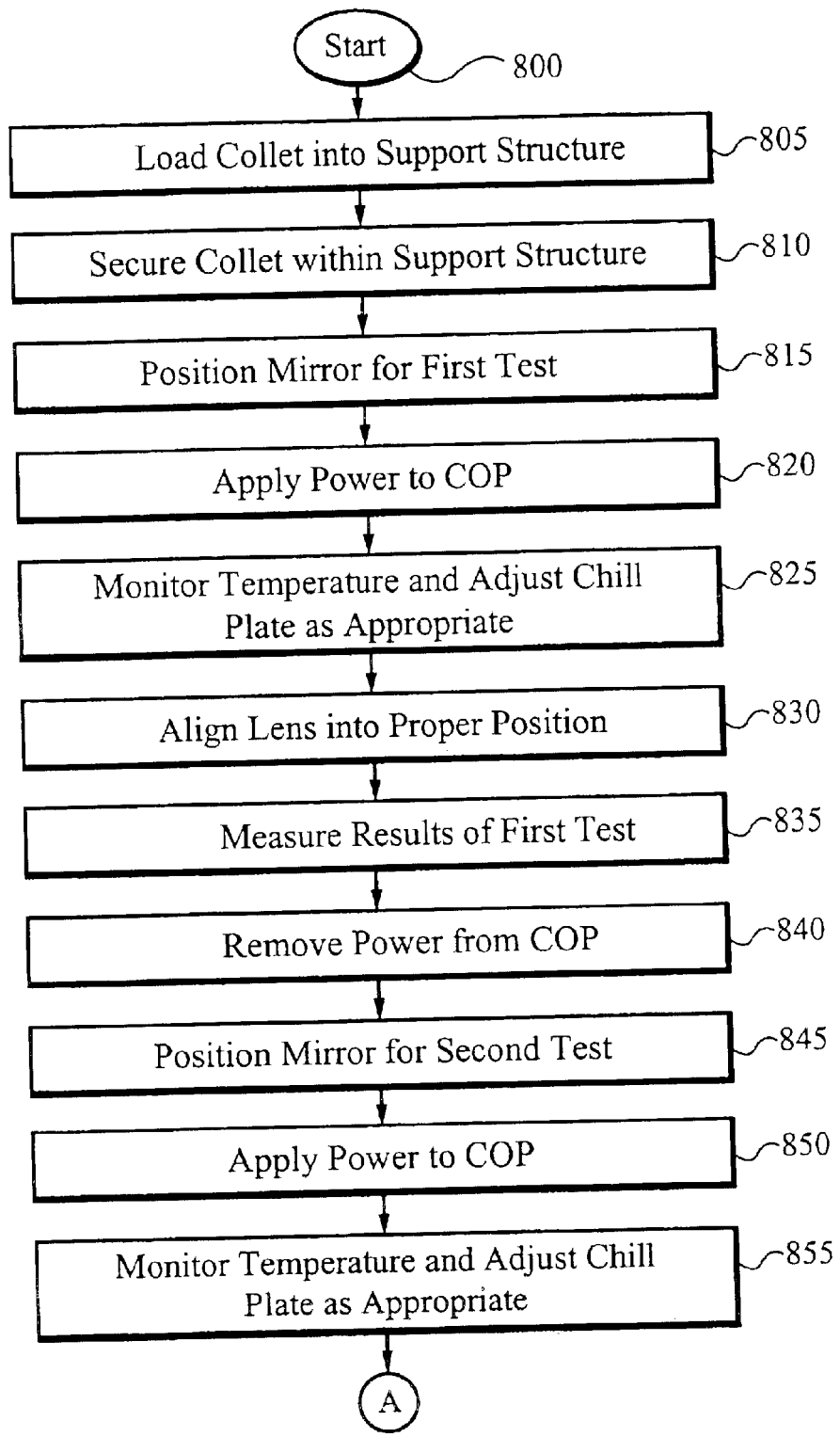
FIG. 9 illustrates a flowchart showing the automated process of the optical system of the present invention.
Figure 9B:
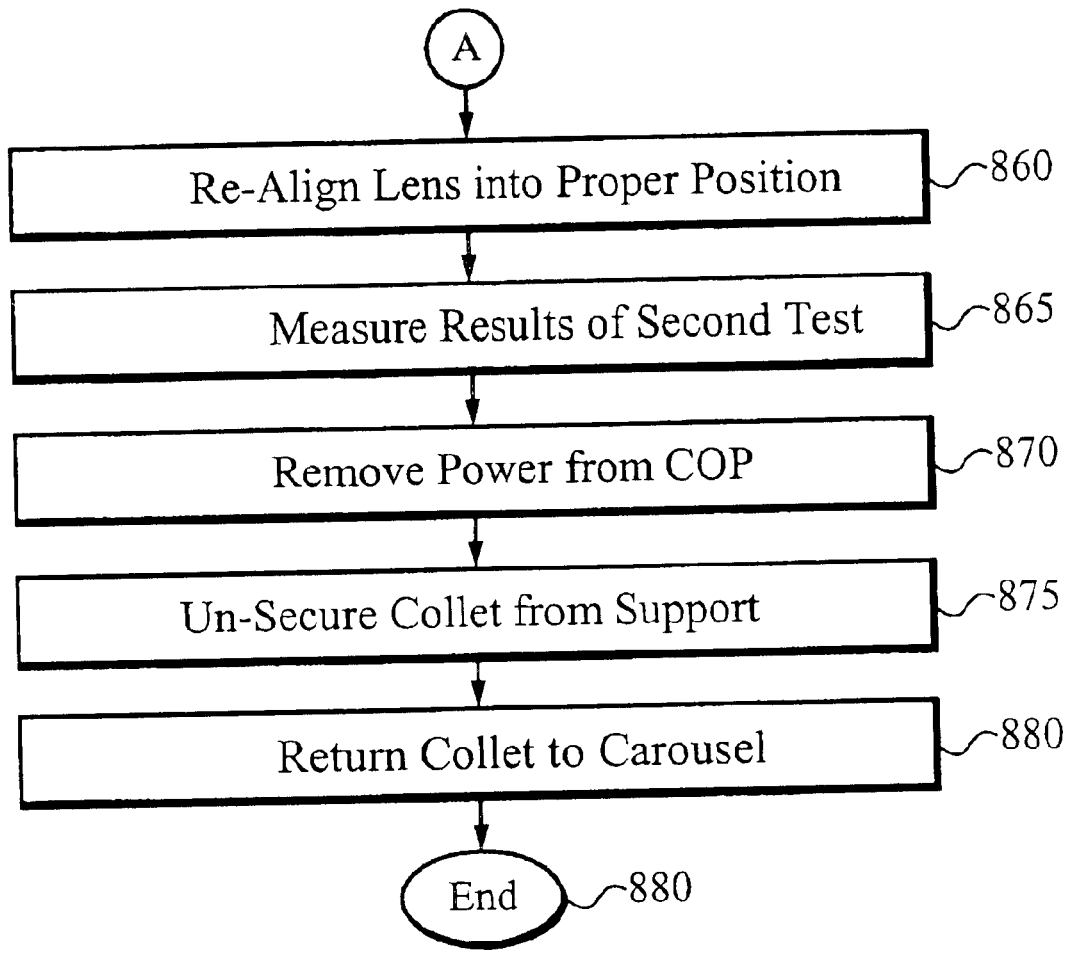

FIG. 9 illustrates a flowchart showing the automated process of the optical system 130 of the present invention. The automated process of the optical system 130 starts at the step 800. At the step 805, the collet 200 is loaded into the support structure 410. The collet 200 is loaded by sliding the collet 200 from the carousel 160 into the support 410 as described in the step 720 of FIG. 8. At the step 810, the collet 200 is secured within the support 410. To secure the collet 200, the collet 200 is slid into the support 410 until the back surface 204 of the collet 200 rests against the pins connected to the back portion of the support 410. The collet 200 is then raised until the collet wings 250 are pressed against the underside of the support rails 420. The collet 200 is raised by air actuators 460 that raise the heat sink 450, which in turn raises the TEC 440 and the chill plate 135. The chill plate 135 rests against the collet 200. The chill plate 135 secures the collet 200 into place while also thermally conditioning the collet 200 to within a predetermined temperature tolerance. At the step 815, the mirror 340 is rotated into position for the first test to be performed. In the case where the power test is the first test, the mirror air cylinder 370 rotates the mirror 340 such that the mirror 340 rests against the stop 350. The mirror air cylinder 370 moves under control instructions received by the control system 140. At the step 820, power is applied to the COP within the collet 200.

At the step 825, sensors located on the chill plate 135 monitor the temperature of the chill plate 135. The sensor data is sent to the control system 140. As power is applied to the COP, the temperature of the COP rises and in turn the temperature of the collet 200 rises as heat dissipates from the COP into the collet 200. As the temperature of the collet 200 rises, the temperature of the chill plate 135 rises as heat dissipates from the collet 200 into the chill plate 135. The sensors attached to the chill plate 135 monitor the temperature increase in the chill plate 135, and in response, the control system 140 sends control instructions to the TEC 440 to increase power thereby reducing the temperature of the TEC 440. As the TEC 440 is cooled, heat dissipates from the chill plate 135 into the TEC 440, and from the TEC 440 to the heat sink 450. If too much heat is dissipated from the chill plate 135, the control system 140 sends control instructions to the TEC 440 to reduce power thereby raising the temperature of the TEC 440. In this manner, the temperature of the chill plate 135, and thereby the collet 200 and the COP under test, is regulated to stay within the predetermined tolerance.

At the step 830, the lens 310 is incrementally aligned into proper position by the aforementioned automated alignment process using the detection system 145 and control instructions sent by the control system 140 to the picomotors 320, 330 and 335. At the step 835, the characteristics of the first test, in this case the power test, are detected by the detection system 145 and analyzed by the optical analyzer 540. The optical analyzer 540 provides the power test results to the computer 510 which stores and associates the power test results with the identification of the current COP under test. At the step 840, power to the COP is turned off. At the step 845, the mirror 340 is rotated into position for the second test to be performed. In the case where the spectrum test is the second test, the mirror air cylinder 370 rotates the mirror 340 such that the mirror 340 rests against the stop 360. At the step 850, power is again applied to the COP within the collet 200.

At the step 855, the temperature of the chill plate 135 is again monitored and adjusted similarly to the step 825. At the step 860, the lens 310 is incrementally aligned into proper position by the aforementioned automated alignment process. At the step 865, the characteristics of the second test, in this case the spectrum test, are detected by the detection system 147 and analyzed by the optical analyzer 550. The optical analyzer 550 provides the spectrum test results to the computer 510 which stores and associates the spectrum test results with the identification of the current COP under test. At the step 870, power to the COP is turned off. At the step 875, the collet 200 is released from its secure position within the optical system 130 by lowering the air actuators 460. At the step 880, the collet 200 is removed from the optical system 130 and returned to the carousel 160. The collet 200 is returned to the carousel 160 by sliding the collet 200 from the optical system 130 into the carousel 160 as described in the step 735 of FIG. 8. The automated process of the optical system 130 ends at the step 885.

In operation, a user loads a tray of COPs to be tested into a loading area. Unless an alarm is sounded which indicates an operations error in the testing system, the user will have no further interaction with the testing system. All steps performed henceforth are performed automatically by the testing system. A loader preferably uses loading jaws to grasp a COP from the tray and carry the COP to a collet located at position 1 within a carousel. As the COP is carried to the collet, the COP passes over a two-dimensional matrix camera which scans an identification image on the bottom of the COP. This identification is used to track and sort the COP and associate the test results with the individual COP. The COP is loaded into the collet, where sensors monitor that the COP is positioned correctly within the collet. The collet is rotated by the carousel to position 7, where the collet is to be loaded into the optical system. While moving from position 1 to position 7, the collet moves to and stops at each position 2–6. Once at position 7, the collet is slid from the carousel into the optical system. Once in the optical system, the collet is secured into place and a predetermined number of tests are performed on the COP. In the preferred embodiment, a power output test and a spectrum test are performed on the laser light generated by the COP. The optical system optimally aligns a lens to properly test the laser light output of the COP. The laser light output is properly directed to one of two detection systems for detecting the desired laser light output characteristic data. The detection system sends the detected data to an optical analyzer within the control system. The optical analyzer sends the analyzed data to a computer which determines proper control instructions to send to the optical system in order to optimally align the lens. An iterative process of receiving deleted data, sending control instructions, and adjusting the alignment of the lens is performed until the lens is optimally aligned. Once optimally aligned, the laser light output data is obtained and the first test results are measured and stored by the computer. Once the first test is completed, the computer instructs the optical system to rotate a mirror to redirect the laser light output to the second detection system. A similar iterative process of optimally aligning the lens is again performed in order to obtain the second test results.

Once the tests are completed, the collet is removed from the optical system and returned to the carousel at position 7. The collet is rotated from position 7 to position 1. While moving from position 7 to position 1, the collet moves to and stops at each position 8–10. When the collet is back at position 1, the COP is removed from the collet. The COP is carried from the collet to the loading area by the loading jaws. As the COP is carried from the collet to the loading area, the COP again passes over the two-dimensional matrix camera that scans the identification image on the bottom of the COP. This final identification is used to verify that the COP being unloaded is the COP that the control system expects to be unloaded. Once all COPs within the tray are tested, the testing system will stop operation. While operation of the automated testing system has been described in terms of a single COP, it should be clear that a series of COPs are simultaneously stepping through the automated testing process.

The present invention has been described in terms of specific embodiments incorporating details to facilitate the understanding of principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to those skilled in the art that while the preferred embodiment of the present invention is used to perform automated testing of laser diode sub-assemblies, the present invention can also be used to perform automated testing of other devices under test (DUTs).

We claim:

1. A testing system comprising:
   a. a handling system for automatically loading and positioning within a given tolerance each of a plurality of laser diode sub-assemblies, the handling system comprising:
      i. a loading device for automatically loading and unloading each of the laser diode sub-assemblies into and out of one of one or more collets; and
      ii. a carousel including one or more more nests, each nest for supporting one of the one or more collets, wherein the carousel moves each collet from a loading position, to one or more testing positions, and to an unloading position;
   b. an optical system for automatically receiving each laser diode subassembly from the handling system and automatically performing one or more tests to measure functionality of each laser diode sub-assembly;
   c. a detection system for detecting characteristics associated with one or more tests performed by the optical system for each laser diode sub-assembly; and
   d. a control system for automatically receiving detected characteristics from the detection system, comparing the detected characteristics to stored expected characteristics for a properly functioning laser diode sub-assembly thereby forming a comparison, and providing control instructions to the optical system based on the comparison.

2. The testing system according to claim 1 wherein each collet supported by the carousel is thermally conditioned by a thermo-electronic controller to within a first thermal tolerance.

3. The testing system according to claim 2 wherein the optical system automatically secures the collet into a specified position by actuating a thermal conditioning apparatus against a bottom surface of the collet.

4. The testing system according to claim 2 wherein the collet, once moved to one of one or more testing positions, is automatically removed from the carousel and loaded into the optical system by the handling system.

5. The testing system according to claim 1 wherein the carousel incrementally rotates through a plurality of positions, wherein the loading position and the one or more testing positions are included within the plurality of positions, further wherein the handling system uses sensors to monitor that the carousel accurately increments from one position to the next.

6. The testing system according to claim 5 wherein the sensors also monitor that the laser diode sub-assembly is positioned within the collet within the given tolerance.

7. The testing system according to claim 1 wherein each collet comprises;
   a. a block of thermally conductive material;
   b. a channel extending vertically through the block and extending horizontally from a front surface of the block towards a back surface of the block without reaching the back surface; and
   c. a positioning hole extending vertically through the block and intersecting the channel, wherein the positioning hole includes a top portion with a width larger than a width of a bottom portion of the positioning hole, further wherein the top portion is sufficiently long as to position the device under test within the positioning hole such that a bottom surface of the device under test rests at a top of the bottom portion of the positioning hole and a top surface of the device under test rests above a top surface of the block,
   wherein the channel is widened from a standard configuration to an extended configuration by applying a prying means to the channel, and the channel returns to the standard configuration from the extended configuration upon removing the prying means from the channel.

8. The testing system according to claim 7 wherein the block is made of beryllium copper.

9. The testing system according to claim 8 wherein the channel includes a wedge-shaped opening at the front surface of the block.

10. The testing system according to claim 9 wherein a cross-section of the top portion of the positioning hole matches a cross-section of the device under test.

11. The testing system according to claim 10 wherein the prying means is a wedge and the channel is widened to the extended configuration by pressing the wedge into the wedge-shaped opening of the channel.

12. The testing system according to claim 11 wherein the width of the top portion of the positioning hole is larger than a width of the channel and equal to a width of the device under test.

13. The testing system according to claim 12 wherein the cross-section of the top portion of the positioning hole and the device under test is circular.

14. The testing system according to claim 1 wherein each collet comprises:

a. a beryllium copper block;

b. a channel horizontally bisecting the block such that the channel extends vertically from a top surface of the block through a bottom surface of the block, and the channel extends horizontally from a front surface of the block past a center of the block but not as far as a back surface of the block, wherein the channel includes a wedge-shaped opening at the front surface of the block; and c. a positioning hole extending from a top center of the top surface of the block to a bottom center of the bottom surface of the block and intersecting the channel, wherein a cross-section of the positioning hole matches a cross-section of the device under test, further wherein the positioning hole includes a top portion with a width larger than a width of the channel and equal to a width of the device under test, and a bottom portion with a width less than the width of the device under test, further wherein the top portion is sufficiently long as to position the device under test within the positioning hole such that a bottom surface of the device under test rests at a top of the bottom portion of the positioning hole and a top surface of the device under test rests above the top surface of the block, wherein the width of the channel is widened from a standard width to an extended width by pressing a wedge into the wedge-shaped opening of the channel and the width of the channel returns to the standard width when the wedge is removed from the wedge-shaped opening.

15. The testing system according to claim 14 wherein the device under test is a laser diode sub-assembly.

16. The testing system according to claim 15 wherein the cross-section of the positioning hole and the laser diode sub-assembly is circular.

\* \* \* \* \*

UNITED STATES PATENT AND TRADEMARK OFFICE
CERTIFICATE OF CORRECTION

PATENT NO. : 6,797,936 B1
DATED : September 28, 2004
INVENTOR(S) : Kessler et al.

It is certified that error appears in the above-identified patent and that said Letters Patent is hereby corrected as shown below:

Title page,
Item [56], References Cited, OTHER PUBLICATIONS, first reference, replace "URL; www.newport.com/tile.store/PDFs/tempPDFs/Model$_{13}$801b_HighDensity2827 .pdf" with -- URL: www.newport.com/file.store/PDFs/tempPDFs/Model_801b_HighDensity2827.pdf --;
second reference, replace " "Laser Diode Bum-In and Life Test Systems– Butterfly Devices" " with -- "Laser Diode Burn-In and Life Test Systems– Butterfly Devices" --;
and replace "Laser_Diode_BumIn4004.pdf" with -- Laser_Diode_BurnIn4004.pdf --.

Column 6,
Line 54, replace "by a user in the loading area 10" with -- by a user in the loading area 110 --.

Signed and Sealed this

Thirtieth Day of November, 2004

JON W. DUDAS
*Director of the United States Patent and Trademark Office*